United States Patent
Linn et al.

[11] Patent Number: 5,882,423
[45] Date of Patent: Mar. 16, 1999

[54] PLASMA CLEANING METHOD FOR IMPROVED INK BRAND PERMANENCY ON IC PACKAGES

[75] Inventors: Jack H. Linn, Melbourne; Mike M. Higley, Palm Bay, both of Fla.

[73] Assignee: Harris Corporation, Melbourne, Fla.

[21] Appl. No.: 754,597

[22] Filed: Nov. 20, 1996

Related U.S. Application Data

[63] Continuation of Ser. No. 487,746, Jun. 7, 1995, abandoned, which is a continuation-in-part of Ser. No. 195,667, Feb. 3, 1994, Pat. No. 5,451,263.

[51] Int. Cl.⁶ ........................................ B08B 7/00
[52] U.S. Cl. ........................................ 134/1.1; 134/1.2
[58] Field of Search ................... 134/1.1, 1.2, 1; 204/192.32; 156/647

[56] References Cited

U.S. PATENT DOCUMENTS

| | | | |
|---|---|---|---|
| 4,529,474 | 7/1985 | Fujiyama et al. | 134/1.1 X |
| 4,797,178 | 1/1989 | Bui et al. | 156/643 |
| 4,816,113 | 3/1989 | Yamazaki | 156/643 |
| 4,975,146 | 12/1990 | Knapp et al. | 156/643 |
| 5,174,856 | 12/1992 | Hawang et al. | 156/643 |
| 5,252,181 | 10/1993 | Dutartre et al. | 156/651 |

*Primary Examiner*—Lyle A. Alexander
*Assistant Examiner*—Saeed Chaudhry
*Attorney, Agent, or Firm*—Daniel J. Staudt

[57] ABSTRACT

A gas phase plasma cleaning method is utilized for removing contaminants from the surface of exposed metallic, ceramic and plastic parts on integrated circuits (IC's). A two step method uses a defined gas mixture of argon and oxygen, followed by ammonia and hydrogen. For plastic packages, a two step method using a fluorinated plasma, followed by oxygen and argon is utilized. The gases are separately introduced into a plasma chamber. The argon oxygen mixture is used to remove carbonatious material by chemical reaction and by milling. The ammonia hydrogen mixture is introduced to chemically remove and reduce oxides and phosphates from the metallic parts. The fluorinate is used to remove surface silicon and organo-silicon compounds from the plastic parts, while the oxygen argon mixture removes carbonatious and ionic compounds from the plastic package surface. Surface energies are increased to permit improved adhesion of inks. Additionally, intermediate oxides on the metallic parts formed after the plasma exposure prevent complete regrowth of the normally passivating oxide layer.

18 Claims, 3 Drawing Sheets

PLASMA CLEANING METHOD FOR IMPROVED INK BRAND PERMANENCY ON IC PACKAGES

FIELD OF THE INVENTION

This patent application is a continuation, of application Ser. No. 08/487,746 filed Jun. 7, 1995, now abandoned, which is a continuation in part of a patent application Ser. No. 08/195,667, Feb. 3, 1994, now U.S. Pat. No. 5,451,263. This invention relates to the field of cleaning exposed plastic and metal parts on integrated circuits packaging (IC's). It relates particularly to the cleaning of plastic and nickel plated parts to increase surface energies for the purpose of applying ink markings, or for solder connections of the nickel plated parts with other metal parts.

BACKGROUND OF THE INVENTION

Ink brand permanency on plastic and metallic IC packaging has always been a critical issue in the semiconductor industry. Lid brands often identify information about the device type, the IC manufacturer, and the date of production. It is not uncommon for semiconductor users to subject IC packages to various chemical cleans before and after attachment to PC boards. If ink adhesion is not satisfactory and/or ink cure is incomplete, the brand may be degraded during the various cleaning operations, resulting in partially or completely illegible brands.

Long-term exposure to reactive ambients (e.g. high humidity, corrosive or polluted air, etc.) can also cause slow degradation of poorly adhered or cured ink brands. Loss of the branding information can result in IC's which are unidentifiable. For this reason, MIL-STD tests have been developed and instituted in the semiconductor industry to evaluate ink brand permanency on package lids. Moisture resistance tests (and salt air exposure) can also help determine brand permanency under more aggressive conditions.

Various lid cleaning, inking, and curing methods have been developed and modified to enhance the brand permanency on plastic molded compound surfaces and metallic packages or lids. One of the most difficult factors to control is the surface chemistry and cleanliness of the package. This directly affects the bonding of the ink to the package. The branding ink will not bond satisfactorily to package or lid surfaces that contain, for the plastic packages, inordinate quantities of old release agents, silicon oils, waxes, and surface organics and, for metal packages, an inordinate amount of metallic oxides or hydrocarbons or other contaminants. These surface contaminants can accumulate as a result of the mold, the molding compound, thermal treatments during the lid seal process and burn-in. Normal workplace air exposure, as well as machine and human handling (e.g. fingerprints), can also contribute to surface contamination of the package. Overall, the most common cause of brand loss is due to lifting or delaminating ink caused by poor ink bonding to the package.

Currently, branding operations for plastic packages, as recommended by the ink vendors, involves exposing the plastic package to solvents in order to clean the molding compound surface and/or exposing the package surface to a hydrogen flame prior to the ink branding. The solvents attempt to remove any chemical contaminants and the hydrogen flame ashes or burns the plastic package surface.

In particular, the solvents that are used to clean the plastic package are typically N-methyl-2-pyrrolidone or various halogenated materials such as 1,1,1-trichloroethane or tetrachloro-ethylene (TCE). The use of these solvents is coming under much closer scutiny, and is in many cases banned. The plastic package is exposed to the solvents by either immersing the package in the solution or by wiping the solvent across the package or lid surface with a wipe.

The other prior art, hydrogen flaming the plastic package, ashes or burns the surface of the package which removes the mold release agents, oils, waxes and surface organics and the like from the surface. However, the hydrogen flame will not effectively remove all of the surface organo-silicon complexes. Controlling the flame, especially in smaller packages, can also be difficult. This thermal exposure can cause localized stressing of the molding compound, which could lead to molding compound cracking, or delamination of the molding compound at the leads and/or die surface. This process can also only be applied to packages one at a time. In addition, many older style branders cannot be effectively retrofitted to accommodate a hydrogen flame apparatus. Various other flames have been used to flame the surface such as acetylene or butane instead of hydrogen.

For metal packaging, current branding operations for metallic packaging, and more specifically nickel plated packaging such as electroplated or electroless plated nickel lids or gold plated nickel, involve the use of wet chemical cleans. These include basic solutions, which have pH values greater than 10 (e.g. Markem 535), and solvents like isopropyl alcohol (IPA), freon, and HCFC. These solutions are recommended as standard surface cleaning methods by the ink vendors and generally result in improved brand permanency compared to uncleaned lids. However, one disadvantage of these wet chemical cleans is the entire package must be immersed.

The Markem 535 solution, for example, contains monoethanolamine and is quite basic (pH>11). Hence, it tends to attack or etch various other materials associated with the packages. The attack is especially notable on the soldered leads, the lid-to-seal ring weld area, and the various plated metallic codes on the packages. This particular brand pre-clean can cause a darkening of these surfaces due to an accelerated build-up of oxides and the formation of 'phospho-oxides' on electroless Ni plated surfaces.

The same aspects of providing a contaminant free surface stated above for plastic and metal also applies to ceramic packaging. The ceramic package material is also etched. In most cases, these anomalies are cosmetic. However, many incidents of darkened leads and/or darkened weld areas are incorrectly assumed to be caused by latent corrosion or thermal stress, when in fact, they are caused by the brand pre-clean solution.

Lead solderability is also affected by the pre-branding cleans. The oxides and 'phospho-oxides' are difficult to remove and can prevent good eutectic formation between the base metal and the solder, resulting in de-wetting and no-wetting areas of solder. Leads solder dipped prior to brand also often exhibit a darkening and pitting of the solder. Reduced solderability is observed in these units as well.

Another drawback of the wet cleaning method is the use of solutions which are costly, difficult to dispose of, and are detrimental to the environment. Maintaining and changing these chemical baths, as well as keeping accurate records of bath changes and chemical disposal, are tedious and time consuming. In addition, several of these solutions can be potentially harmful to workers over a period of extended exposure.

SUMMARY OF THE INVENTION

Disclosed is a method and the apparatus for performing the method for cleaning exposed plastic, ceramic and metal material on an integrated circuit (IC). According to the inventive principles as shown in the preferred embodiment, an IC may be placed in a plasma chamber with a defined gaseous mixture. An RF field is created around the IC for a set period of time. The plasma created in the gaseous mixture by the RF energy is sufficient to remove contaminants on the surface of the material.

For plastic materials, a fluorinated plasma may initially be used, such as $CF_4$, $CHF_3$ or $SF_6$. Its effectiveness can be improved further by applying a combined fluorinated/oxygen plasma to to aid in ashing or oxidzing the organic materials. The use of the fluorinated plasmas, or fluorinated plasmas combined with oxygen, are very effective in removing the organics, surface silicon and the organo-silicon compounds. Another mixture that can be used is the oxygen and argon plasma to remove any remaining contaminants after exposure to the fluorinated plasma atmosphere.

For metallic and ceramic materials, oxygen and argon may be introduced to form the plasma. The oxygen is useful for removing carbonaceous material while the argon provides a milling effect to remove other contaminants. Another mixture which may be introduced is ammonia and hydrogen. The hydrogen in the ammonia/hydrogen gas mixture reduces the nickel oxides to nickel and the ammonia is used to etch and remove nickel phosphates from electroless plated packages and lids.

According to the inventive principles, as shown for the preferred embodiment, surface energies greater than 70 dynes/cm are attainable. Further exposure to a chemically reducing plasma such as hydrogen or ammonia and hydrogen is also shown to passivate a metal surface and limit a complete regrowth of the normal passivating oxide layer.

The advantages of the method of the present invention is that the plasma provides a consistent and repeatable cleaning environment. The gases selected and the sequence of the exposure of the packaging to the plasma atmosphere creates a highly specific cleaning of the surface of the packages. All types of lids and packages including metal, ceramic and plastic are effectively cleaned with the gas treatments of the present invention. The plasma chemistry can be adjusted so that no damage to the packages and the parts is incurred from either chemcial attack or thermal exposure. In general the packaging and parts are positively effected by the plasma exposure taught by the present invention.

DESCRIPTION OF PREFERRED EMBODIMENT

The inventive method disclosed is a plasma atmosphere used in connection with the cleaning of plastic, ceramic and metal materials. The metal material such as an electroless plated nickel lids and other metallic exposed parts are used for packaging the integrated circuits (IC's) chip. The plated electroless nickel in the preferred embodiment is over Kovar (iron, nickel and cobalt). The IC package may consist of molded plastic body, a ceramic body, a metallic body or lid, brazed lead pads, electroless nickel plated leads and lid lead pads and a seal ring. As known to those skilled in the art, the phosphorous content of the electroless nickel plate is between 7% and 11%. In the preferred embodiment, the lid for metal packages is sealed to the body with a cold weld seal.

Figure 1:
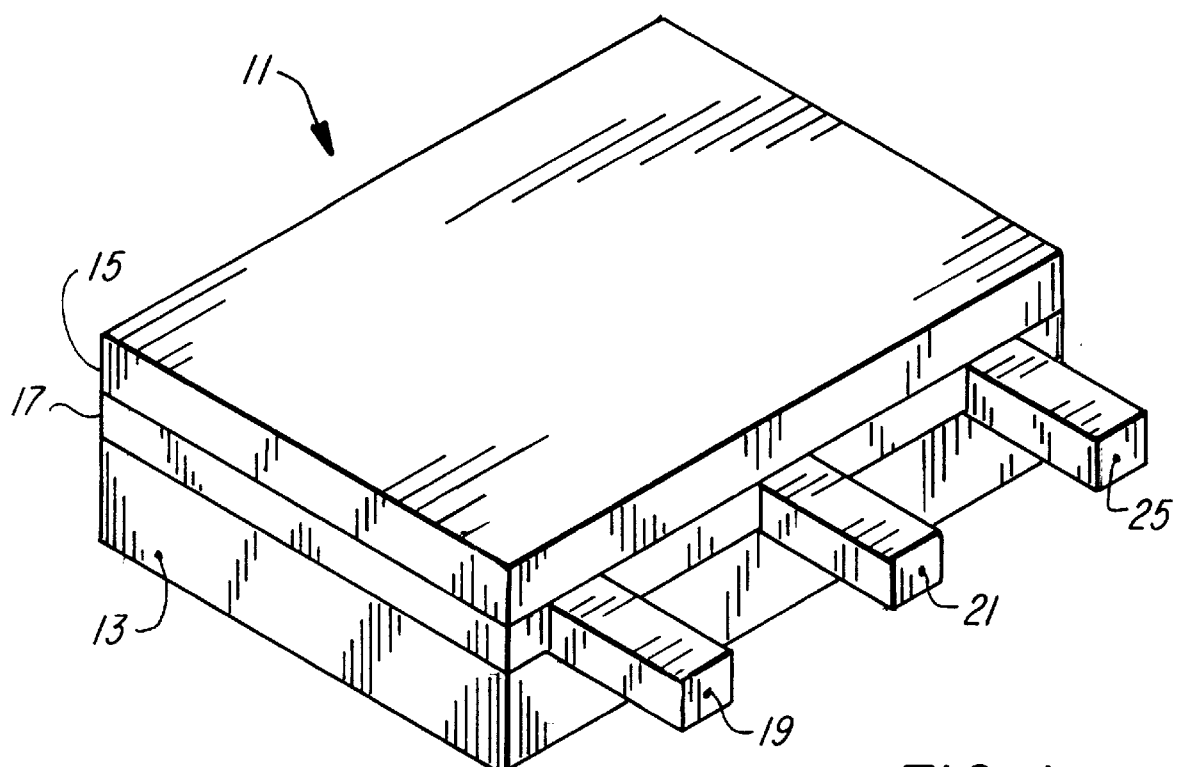
FIG. 1. shows a lid sealed integrated circuit, as an example.

An IC package is well known in the art and is shown in FIG. 1 as an example and for reference purposes only. As shown in FIG. 1, an IC with a package is indicated generally as 11. The IC comprises a plastic molding compound or ceramic body 13 and a lid 15. The lid is made up of plastic molding compound, ceramic or plated nickel. A seal 17 is shown between the lid 15 and the body 13. An integrated circuit is within the body 13 and enclosed by seal 17 and lid 15. Extending from the integrated circuit are leads 19, 21 and 25. As would be known to those skilled in the arts, additional leads (not shown) may extend from both sides of the IC 11. Also, the entire IC maybe packaged within a plastic molding compound which may also be one piece that is molded around the IC.

Figure 2:
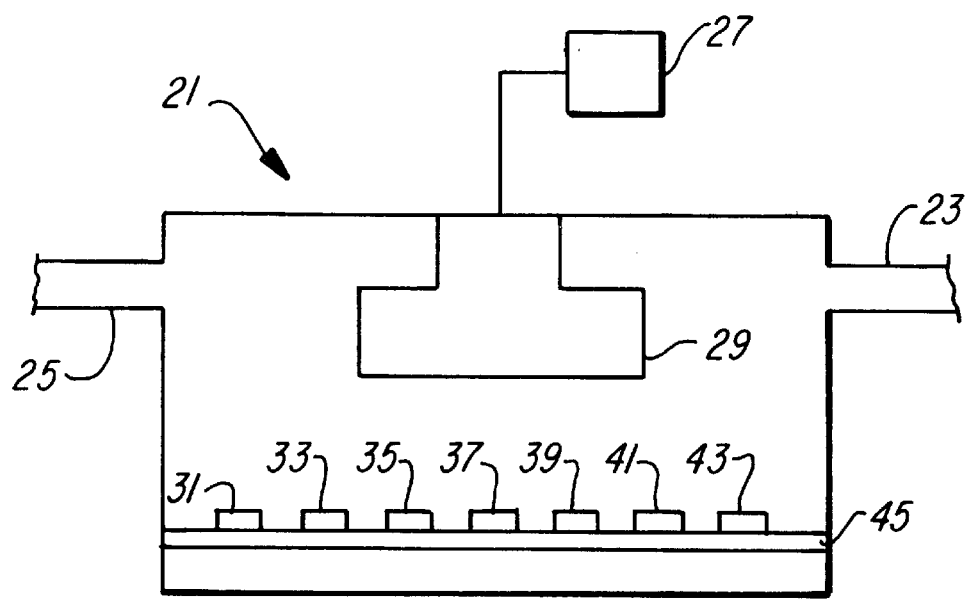
FIG. 2. shows a schematic form, a representation of a plasma chamber used in accordance with the present invention to clean the sealed integrated circuit surface.

According to the inventive principles, the package and the leads are cleaned using a plasma cleaning process with the defined gases. In a preferred environment, a plasma chamber as shown schematically in FIG. 2 is used. The plasma chamber has a gas inlet 23 and outlet 25. A source of power 27 is connected to an RF generator 29. The IC's are shown as 31, 33, 35, 37, 39, 41, 43 on metal tray 45 within the chamber 21. In the preferred embodiment, the chamber is operated at 12 MHz to 16 MHz and preferably 14.56 MHz with RF power at 200 W to 3 kW and preferably 2 kW. The IC's were maintained at 70° C. or ambient temperature throughout the plasma exposure, depending upon the gases that are used or the packages or lids to be cleaned. Any suitable plasma chamber may be used. In the preferred environment an Advanced Plasma Systems Corporation (APS) tool was used.

Figure 3A:
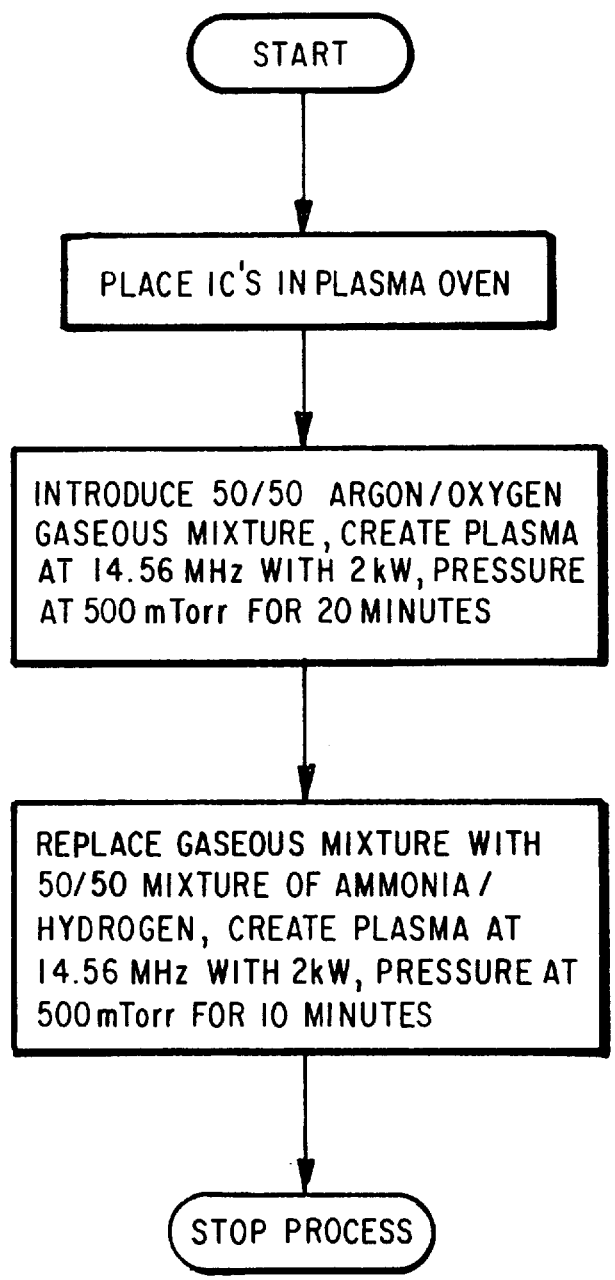
FIG. 3a. is a flow chart of the process of the present invention for cleaning the integrated circuit surfaces.

The plasma cleaning process for metallic or ceramic parts according to the present invention is a two step plasma cleaning process as shown in the flow chart of FIG. 3a. The first plasma cleaning was created by placing the IC's in the plasma chamber with a 50% argon and 50% oxygen gaseous mixture at 500 mTorr for twenty minutes. The second part of the plasma cleaning process is exposing the IC package to a 500 mTorr ammonia/hydrogen plasma cleaning for ten minutes. As stated above, the plasma was generated at 14.56 MHz at 2 kW and the IC was maintained at 70° C.

An IC package construction consisting of a ceramic or metal package body, brazed lead pads, nickel plated leads, brazed pads, and a lid when cleaned according to the inventive principles described above tests show no noticeable physical deterioration produced on the exposed metal parts.

Figure 3B:
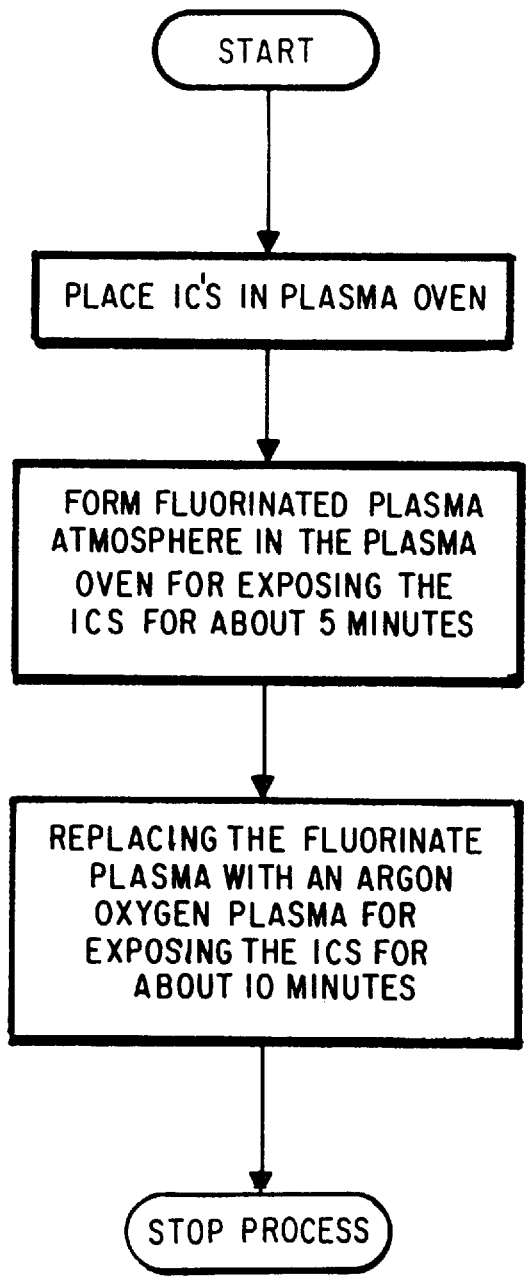
FIG. 3b. is a flow chart of an alternate process of the present invention for cleaning the integrated circuit package surface.

The plasma cleaning process for plastic packaging according to the present invention and as shown on the flow chart of FIG. 3b is a two step plasma cleaning process. The first plasma cleaning step is performed by exposing the plastic IC package to a plasma atmosphere of fluorinated plasma such as $CF_4$, $CHF_3$ or $SF_6$ for about 2 to 10 minutes and preferably 5 minutes. This first plasma cleaning step could also be a mixed fluorinated/oxygen plasma. The second plasma cleaning step is performed by exposing the IC package to a plasma atmosphere of a mixture of argon and oxygen for 5 to 15 minutes and preferably 10 ten minutes. This step is similar to the hydrogen firing in that it ashes the organic, but unlike the hydrogen firing, the plasma environment (due to the argon) removes ionics from the surface, such as fingerprints, along with polymers, waxes, and oils that are not readily ashed during the first step of exposure to the fluorinated gas. The plasma chamber is operated between 200 W and 3 kW prefferably 2 kW the gas pressure between 100 and 500 mTorr and at ambient temperature. If a mixture of a fluorinated/oxygen plasma is used in the first step, the 2nd step of oxygen and argon may be optional.

An advantage in the cleaning of the plastic packaging using the fluorinated plasma is the etching away of the silicon and organo-silicon compounds from the molding compound surface. Another advantage is the package is not exposed to extreme localized heating that occurs with hydrogen firing. Yet a further advantage is that all of the packaging can be batched processed in the plasma atmosphere, wherein the prior art hydrogen firing must by done one package at a time. The plasma also eliminates the safety concern of the hydrogen firing method. The plasma cleaning has no negative effects on the packaging or the leads, in fact the lead solderability improves after the plasma cleaning.

The use of the argon/oxygen gaseous mixture in the plasma on the metallic packaging and parts removes carbonaceous material from the lead by chemical reaction and by milling. The milling effect is produced by the argon which works with the chemical reaction by the oxygen to remove all of the residual carbonaceous material. The use of argon and oxygen in the plasma atmosphere for the plastic packages removes the unreacted surface polymers, plastic mold release agents, unreacted organics, fingerprints and ionic species among other contaminants. The hydrogen, in the ammonia hydrogen gas mixture, reduces nickel oxides to nickel while the ammonia is used to etch and remove the nickel phosphates.

Cleaning according to the inventive principles, produces surface energies greater than 70 dynes/cm. This is a level high enough to consistently obtain satisfactory ink brand adhesion to the electroless nickel surface. For comparison surfaces, unclean nickel lids with normal passivating layers of nickel oxide and surface contaminates typically possess values in the energy of 30 to 40 dynes/cm range and produce unsatisfactory ink adhesion.

In the preferred environment, an ink brand was stamped on the package within 30 minutes after cleaning. The inventive principles are shown with regard to plastic, ceramic and plated nickel packages and lids used with an IC. The package is cleaned using a plasma cleaning process with the defined gases to remove material covering the package and to increase its surface energy for better adhesion of an ink brand. The inventive principles for the metallic packaging are not limited to the disclosed invention but may be used with some electroplated nickel or gold plated stamp nickel or with other materials by varying the gas mixture.

According to the inventive principles, the use of plasma with gases may be successfully used to remove contaminates on the surface of a material by chemical reaction or by milling. Further, the plasma reduction of the metallic surface contaminates passivates the metallic surface and then minimizes regrowth of oxides after air exposure.

A flow chart for the process is as shown in FIGS. 3a and 3b. The process is shown with respect to the defined gaseous mixture of ammonia and hydrogen or fluorinated gas and for argon/oxygen as stated above.

For the metallic packages the indications are intermediate oxides form after the plasma exposure. This plasma exposure passivates a metal surface and prevents a complete regrowth of the normally passivating oxide layer. This limiting of the oxide regrowth allows for at least one hour to pass after the cleaning process before surface energy degrades below 60 dynes/cm.

It is noted that this method and apparatus of the invention as described above is not limited to integrated circuit packaging but may also be used for cleaning any plastic, ceramic or metallic material to prepare it for marking.

Accordingly, while the methods herein described, and the forms of apparatus for carrying out these methods into effect, constitute preferred embodiments of this invention it is to be understood that the invention is not limited to theses precise methods and forms of apparatus, and that changes may be made in either without departing from the scope of the invention, which is defined in the appended claims.

What is claimed is:

1. A method of cleaning the exterior portions of an integrated circuit package for subsequently marking the exterior portions of the integrated circuit package with identifying characters, comprising the sequential steps of:

a first cleaning step of exposing the integrated circuit package to a fluorinated plasma atmosphere in a plasma chamber for a first period of time, for removing contaminants from the integrated circuit package and etching the integrated circuit package; and a second cleaning step of exposing the integrated circuit package to an oxygen and argon plasma atmosphere for a second period of time for removing contaminants from the integrated circuit package and for removing the carbonaeous material from and milling the integrated circuit package.

2. The method according to claim 1 wherein the step of exposing the integrated circuit package for the second period of time is further defined by exposing the integrated circuit package for about 5 to 15 minutes to the oxygen and argon plasma atmosphere.

3. The method according to claim 1 wherein said step of exposing the integrated circuit package to the oxygen and argon plasma atmosphere in the plasma chamber is further defined by introducing about 50% oxygen and about 50% argon into the plasma chamber.

4. The method according to claim 1 wherein the fluorinate is selected from the group consisting of $CF_4$, $CHF_3$ and $SF_6$.

5. The method according to claim 1 wherein the fluorinated plasma comprises a mixture of fluorinate and oxygen.

6. The method according to claim 1 wherein the step of energizing a radio frequency plasma atmosphere in the plasma chamber is further defined by establishing and maintaining the plasma chamber between 100 and 500 mTorr.

7. The method according to claim 1 wherein the step of exposing the integrated circuit package for the first period of time is further defined by exposing the integrated circuit package for about 2 to 10 minutes to the fluorinated plasma atmosphere.

8. The method according to claim 1 wherein the step of energizing the plasma atmospheres in the plasma chamber is further defined by establishing and maintaining the plasma chamber at about ambient temperature.

9. A method of cleaning plastic for subsequently marking the exterior portions of the plastic with identifying characters, comprising the sequential steps of:

energizing a radio frequency plasma atmosphere with a fluorinate in a plasma chamber at about 100 to 500 mTorr of pressure, with about 200 W to 3 kW of power, at about ambient temperature, and at about 12 to 16 MHz;

exposing the plastic to the fluorinated plasma atmosphere in the plasma chamber to remove surface contaminates from the exterior portions of the plastic and etching the plastic;

removing the fluorinate gas from the plasma chamber;

energizing a radio frequency plasma atmosphere with oxygen and argon in the plasma chamber at about 100 to 500 mTorr of pressure, with about 200 W to 3 kW of power, at about ambient temperature, and at about 12 to 16 MHz; and exposing the plastic to the oxygen and argon plasma atmosphere to further remove surface contaminates from the exterior portions of the plastic and milling the plastic.

10. The method according to claim 9 wherein step of exposing the plastic to oxygen and argon plasma atmosphere is further defined by exposing the plastic to about equal portions of oxygen and argon in order to remove the surface contaminates from the exterior portions of the plastic.

11. The method according to claim 9 wherein step of exposing the plastic to the fluorinated plasma atmosphere is further defined by exposing the plastic to a fluorinate selected from the group consisting of $CF_4$, $CHF_3$ and $SF_6$.

12. A method of cleaning the surface of a material consisting of plastic, ceramic or metallic or any combination of plastic ceramic or metal, comprising the sequential steps of:

energizing a radio frequency plasma atmosphere with a fluorinate in a plasma chamber;

a first cleaning step of exposing the material to the fluorinated plasma atmosphere in the plasma chamber for a first period of time for removing contaminants from the surface of the material and etching the material;

establishing a radio frequency plasma atmosphere with oxygen and argon in the plasma chamber; and a second cleaning step of exposing the material to the oxygen and argon plasma atmosphere for a second period of time for removing any remaining surface contaminants from the material and milling the material to remove all surface compounds.

13. The method according to claim 12 wherein said step of energizing an oxygen and argon plasma atmosphere in the plasma chamber is further defined by introducing about 50% oxygen and about 50% argon into the plasma chamber.

14. The method according to claim 12 wherein the fluorinate is selected from the group consisting of $CF_4$, $CHF_3$ and $SF_6$.

15. The method according to claim 12 wherein the steps of energizing a radio frequency plasma atmosphere in the plasma chamber is further defined by establishing and maintaining the plasma chamber between 100 and 500 mTorr.

16. The method according to claim 12 wherein the step of exposing the material for the first period of time is further defined by exposing the material for about 2 to 10 minutes to the fluorinated plasma atmosphere.

17. The method according to claim 12 wherein the step of exposing the material for the second period of time is further defined by exposing the material for about 5 to 15 minutes to the oxygen and argon plasma atmosphere.

18. The method according to claim 12 wherein the steps of energizing the plasma atmospheres in the plasma chamber is further defined by establishing and maintaining the plasma chamber at about ambient temperature.

\* \* \* \* \*